United States Patent
Tan et al.

(10) Patent No.: US 6,650,684 B1
(45) Date of Patent: Nov. 18, 2003

(54) SURFACE EMITTING LASER DIODES WITH ENHANCED HIGHER ORDER SPATIAL MODES AND/OR FILAMENTATION

(75) Inventors: Michael R. T. Tan, Menlo Park, CA (US); Kenneth H. Hahn, Cupertino, CA (US); Long Yang, Union City, CA (US); Shih-Yuan Wang, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 08/566,222

(22) Filed: Dec. 1, 1995

Related U.S. Application Data

(63) Continuation of application No. 08/273,036, filed on Jul. 8, 1994, now abandoned.

(51) Int. Cl.$^7$ ................................................. H01S 3/08
(52) U.S. Cl. ............................. 372/99; 372/43; 372/45; 372/50
(58) Field of Search ........................... 372/45, 99, 43, 372/50

(56) References Cited

U.S. PATENT DOCUMENTS

| | | | |
|---|---|---|---|
| 4,958,357 A | * | 9/1990 | Kinoshita ..................... 372/50 |
| 5,086,430 A | | 2/1992 | Kapon et al. .................. 372/50 |
| 5,314,838 A | * | 5/1994 | Cho et al. ...................... 372/45 |

OTHER PUBLICATIONS

Chow et al, "Many Body Effects in the Temperature Dependence of Threshold in a Vertical–Cavity Surface–Emitting Laser", Appl. Phys. Lett. 66(19), pp 2460–2462, May 8, 1995.*

Warren et al, "On–axis far–field emission from 2–D phase–locked vertical cavity surface–emitting laser arrays w/integrated phase–corrector" Appl. Phys. Lett. Vol 61, No 13, Sep. 1992 pp 1484–1486.*

* cited by examiner

*Primary Examiner*—Brian Healy

(57) ABSTRACT

A surface-emitting laser ("SEL") having predictable filamentation initiation. The SEL includes a light generation layer and first and second mirror layers. The first and second mirror layers reflect light generated in the light generation region back toward the light generation region. Each of the mirrors reflects light such that it adds coherently to the light generated in the light generation region or to the light reflected from the other mirror. One of the mirrors includes a localized imperfection which causes light interacting therewith to be attenuated or shifted in phase relative to light that does not interact with the imperfection region. As a result, lasing filaments are preferentially initiated in the regions adjacent to the localized imperfection.

2 Claims, 2 Drawing Sheets

SURFACE EMITTING LASER DIODES WITH ENHANCED HIGHER ORDER SPATIAL MODES AND/OR FILAMENTATION

This is a continuation of copending application Ser. No. 08/273,036 filed on Jul. 8, 1994, now abandoned.

FIELD OF THE INVENTION

The present invention relates to lasers, and more particularly, to an improved surface emitting laser diode.

BACKGROUND OF THE INVENTION

Semiconductor laser diodes were originally fabricated in a manner that led to a diode structure that was parallel to the surface of the semiconductor wafer. In this structure, light is emitted from the edge of the structure such that the light was also emitted parallel to the surface of the semiconductor wafer. Unfortunately, this structure does not lend itself to the cost-effective fabrication of arrays of laser diodes.

A second class of laser diodes is fabricated such that the laser structure is perpendicular to the surface of the semiconductor wafer and the light is emitted perpendicular to the surface. These laser diodes are commonly known as surface emitting lasers (SELs). These lasers are better suited for the fabrication of arrays of lasers for displays or driving arrays of optical fibers.

It would be advantageous to be able to operate large area SELs in the higher order transverse modes. This requires high current injection levels. The high current injection can lead to a reduced lifetime for the SEL. In addition, the modes are not always reproducible from device to device.

In general, SELs have a threshold potential that must be applied to obtain light output. In large area SELs, filaments appear at potentials near the threshold. Each filament is a small lasing region. As the potential is increased, the number of filaments increases until the entire area of the SEL produces light by the joining of the various filaments. The locations at which these filaments are initiated and the density of filaments are not predictable in prior art devices.

Broadly, it is the object of the present invention to provide an improved large area SEL.

It is a further object of the present invention to provide an SEL in which filament initiation and density are more easily controlled.

These and other objects of the present invention will become apparent to those skilled in the art from the following detailed description of the invention and the accompanying drawings.

SUMMARY OF THE INVENTION

The present invention is a SEL having a light generation and first and second mirror layers. The first and second mirror layers reflect light generated in the light generation region back toward the light generation region. Each of the mirrors reflects light such that it adds coherently to the light generated in the light generation region or light reflected from the other mirror. In the preferred embodiment of the present invention, one of the mirrors includes a localized imperfection which causes light interacting therewith to be attenuated or shifted in phase relative to light that does not interact with the imperfection region. As a result, lasing filaments are preferentially initiated in the regions adjacent to the localized imperfection.

DETAILED DESCRIPTION OF THE INVENTION

Figure 2:
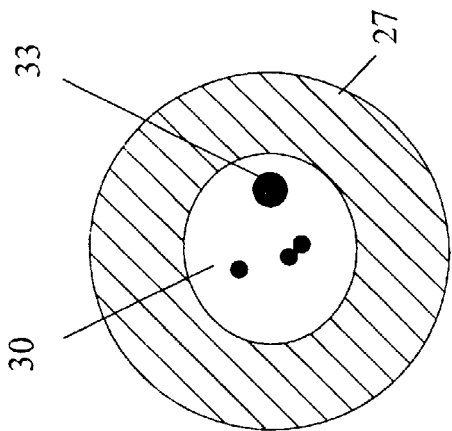
FIG. 2 is a bottom view of the SEL shown in FIG. 1.
Figure 1:
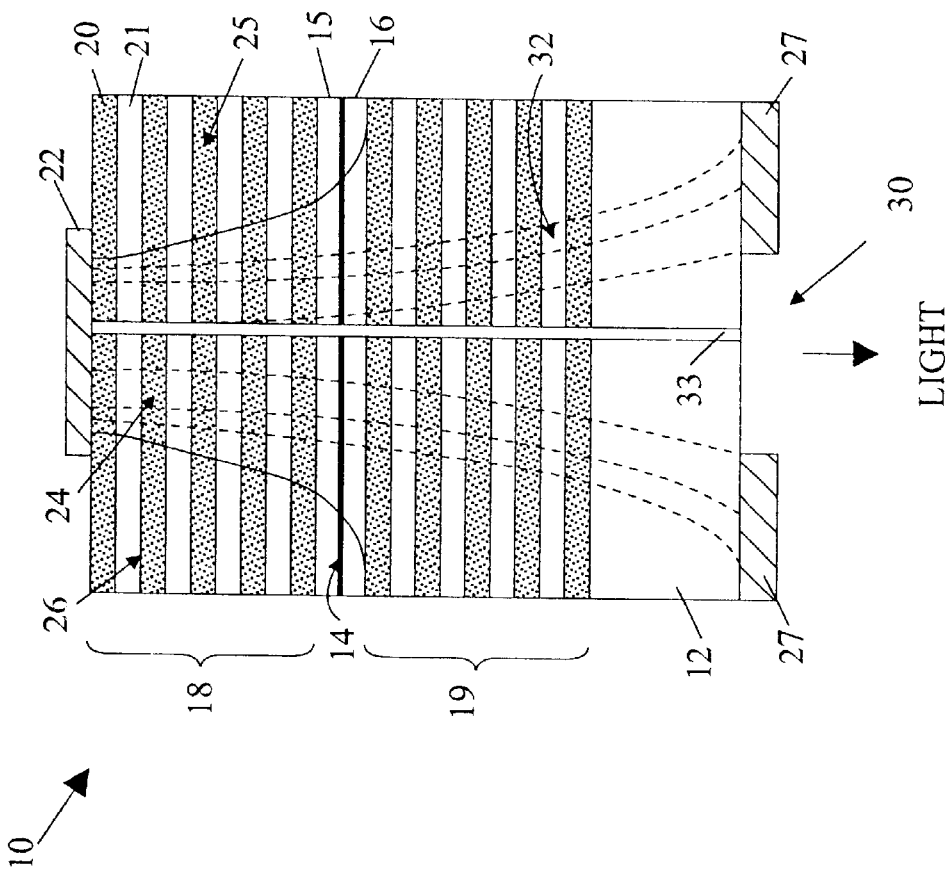
FIG. 1 is cross-sectional view of a conventional bottom emitting SEL.

The present invention may be more easily understood with reference to FIGS. 1 and 2 which are cross-sectional and bottom views, respectively, of a conventional SEL 10. Since construction of SELs is well known to those skilled in the laser arts, it will not be described in detail here. For the purposes of this discussion, it is sufficient to note that SEL 10 may be viewed as a p-i-n diode having a top mirror region 18, a light generation region 14, and a bottom mirror region 19. These regions are constructed on a substrate 12. Electrical power is applied between electrodes 22 and 27. The various layers are constructed by epitaxial growth.

The active region is typically constructed from one or more quantum wells of InGaAs which is separated from mirror regions 18 and 19 by spacers 15 and 16 respectively. This layer may be viewed as a light generation layer which generates light due to spontaneous and stimulated emission via the recombination of electrons and holes generated by forward biasing the p-i-n diode.

The mirror regions are constructed from alternating layers of which layers 20 and 21 are typical. These layers have different indices of refraction. The thickness of each layer is chosen to be one quarter of the wavelength of the light. The stacks form Bragg mirrors. The stacks are typically constructed from alternating layers of AlAs and GaAs. To obtain the desired reflectivity, 15 to 20 pairs of layers are typically required. The layers in the upper mirror region 18 are typically doped to be p-type semiconductors and those in the lower mirror region 19 are doped to be n-type semiconductors. Substrate 12 is preferably an n-type contact. Bottom electrode 27 is preferably an n-ohmic contact.

The current flow between electrodes 22 and 27 is confined to region 24 by implanting regions 25 and 26 to convert the regions to regions of high resistivity. This is typically accomplished by implanting with hydrogen ions. Typical electric field lines are shown at 32. This implant localizes the current flow over window 30.

It should be noted that SEL 10 is not shown to scale in FIG. 1. In particular, the mirror regions and active regions have been expanded to provide clarity in the drawing. In practice, the thickness of region 12 is typically 150 μm compared to about 10 μm for the mirror and active regions. Window 30 in bottom electrode 27 is approximately 150 μm in diameter while top electrode 22 is only 25 μm in diameter.

As the potential between electrodes 22 and 27 is increased, lasing filaments such as filament 33 begin to appear. The location, size, and number of such filaments is more or less random. However, the size and number of filaments increases as the potential is increased. In addition, the filaments progress to higher order spatial modes as the potential across the SEL increases.

The lack of predictability of the density of filaments and the exact onset voltage causes problems in arrays of laser diodes, since these parameters vary from diode to diode in the array. Hence, it would be advantageous to provide a means for controlling the filament formation process. The present invention provides such a means.

Figure 3:
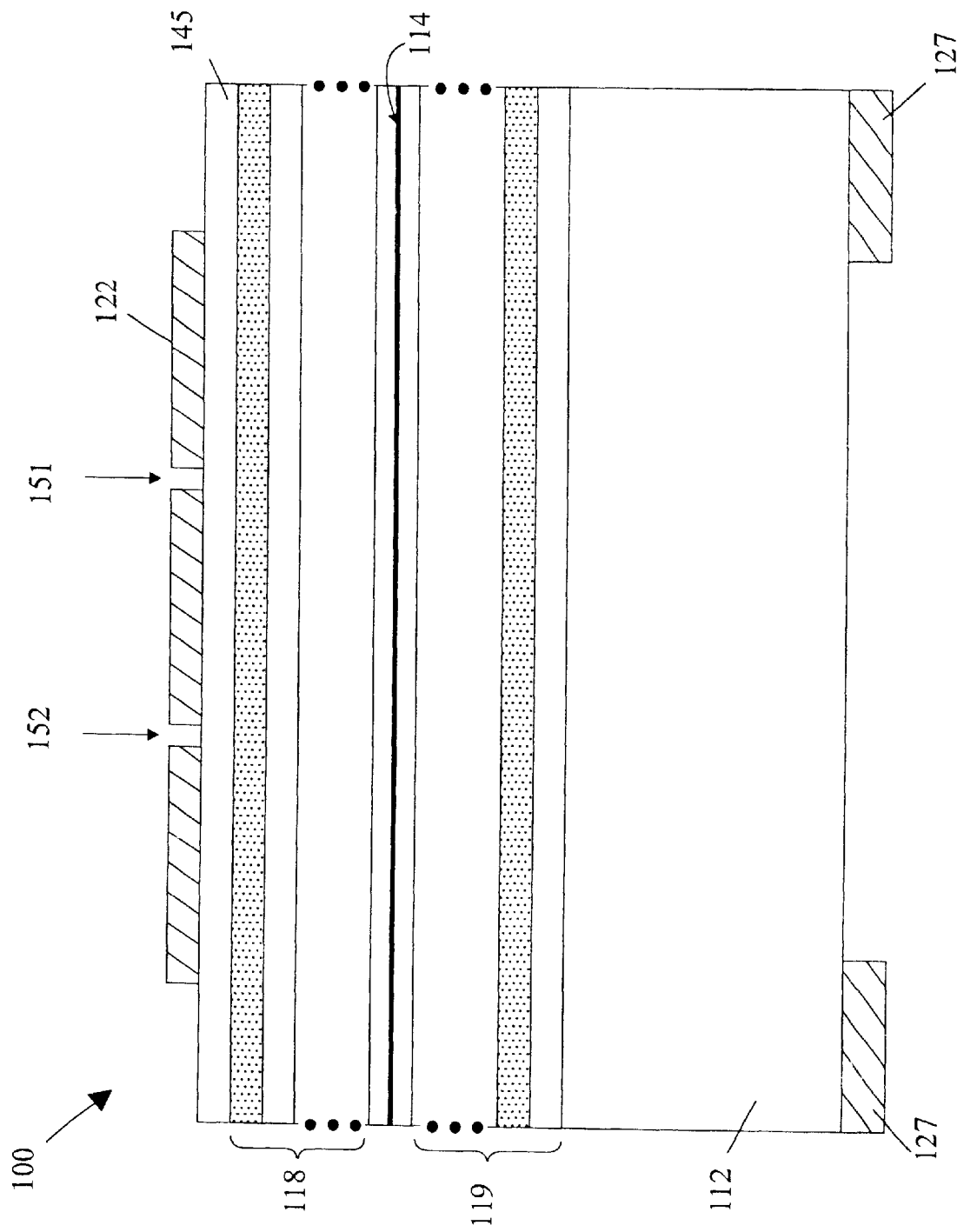
FIG. 3 is a cross-sectional view of one embodiment of an SEL according to the present invention.

Refer now to FIG. 3 which is a cross-sectional view of one embodiment of a bottom emitting SEL 100 according to the present invention. SEL 100 is similar to SEL 10 in that it is constructed from top and bottom mirror regions 118 and 119 which are constructed from alternating quarter wavelength layers of p-type and n-type semiconductors, respectively. Light is generated in an active region 114. The potential is applied across this p-i-n structure by applying a voltage between electrodes 122 and 127. High resistivity regions analogous to regions 25 and 26 are also present in SEL 100, however, these have been omitted from the drawing to reduce the complexity of the drawing.

The present invention is based on the observation that introducing imperfections in the coherent reflection of the light at the top boundary of SEL 100 affects the location and reproducibility of filament formation. Electrode 122 is typically constructed from gold that is deposited on a phase correcting layer 145. The phase correcting layer is needed because Au is not a perfect conductor. The Au layer acts as a mirror for any light that is not reflected by mirror layer 118. Hence, any losses in this reflection will affect the gain of the laser. The combination of layer 145 and electrode 122 will be referred to as the upper mirror surface in the following discussion.

Imperfections may be induced in the upper mirror surface by introducing regions of high loss such as shown at 151 and 152. In the simplest case, regions 151 and 152 are generated by removing small areas of electrode 122. It has been found experimentally that regions of the order of 2 $\mu \times 2\ \mu$ are sufficient for the purposes of the present invention. However, it will be apparent to those skilled in the art that other sized imperfections may also be used. For any given application, the optimum size may be determined experimentally. In applications in which the SEL is mounted by attachment of the top electrode to a conducting surface, the top electrode structure shown in FIG. 2 may be covered with a conductor having poor reflectivity such as titanium or a titanium-gold layer. This layer fills in the imperfections but leaves regions of poor optical reflectivity.

It is found experimentally that filaments form preferentially in the areas adjacent to such imperfections. It is believed that this formation results from the fact that the gain along a path passing through the imperfection is higher than in the surrounding regions because the light intensity along this path is less than in the surrounding regions.

Localized imperfections can also be introduced into phase correcting layer 145. Since gold is not a perfect conductor, a phase correction is required at the gold interface. This correction is provided by layer 145. If local imperfections resulting in small regions in which the index of refraction differs from the correct index are introduced into layer 145, the light passing through those imperfections will be out of phase with the other light and the coherent addition of the light will be reduced.

The above-described embodiments assume that top mirror region 118 has less than perfect reflectivity, and hence, there is sufficient light reaching electrode 122 for the reflection from the electrode to contribute significantly to the overall reflectivity of the top mirror. In practice, it is found that the amount of light leaving mirror region 118 in the absence of electrode 122 must be at least 98%. The reflectivity of the gold electrode covered region is increased to 99.9% by the gold electrode.

Similarly, bottom mirror region 119 also has less than perfect reflectivity. However, in this case, the reflectivity is set to provide the desired amount of light leaving the window.

While the above-described embodiments operate by introducing imperfections in the upper mirror, it will be apparent to those skilled in the art that the localized imperfections could, in principle, be introduced into any of the mirror layers. As long as the imperfections result in the light passing therethrough being attenuated or shifted in phase such that it is out of phase with the light satisfying the lasing conditions, a filament will be induced in the region adjacent to the imperfection. The present invention preferably operates by introducing the imperfections at the top mirror boundary because the introduction of imperfections at this layer does not complicate the growth of the various mirror layers.

Various modifications to the present invention will become apparent to those skilled in the art from the foregoing description and accompanying drawings. Accordingly, the present invention is to be limited solely by the scope of the following claims.

What is claimed is:

1. A SEL comprising:

a light generation layer for generating light in response to light passing therethrough;

first mirror means for reflecting light generated in said light generation layer toward said light generation layer such that said reflected light adds coherently to said light generated in said light generation layer; and second mirror means for reflecting light generated in said light generation layer toward said light generation layer such that said reflected light adds coherently to said light generated in said light generation layer.

wherein said light generation layer lies between said first and second mirror means, and wherein said first mirror means includes a localized imperfection region which causes light interacting with said imperfection region to be attenuated or shifted in phase relative to light that does not interact with said imperfection region, and wherein said first mirror means comprises a phase correcting layer, said phase correcting layer altering the phase of said light passing therethrough and wherein said localized imperfection comprises a region of said phase correcting layer having an index of refraction differing from the index of refraction of the remainder of said phase correcting layer.

2. A method for inducing uniform filament formation in large-area SEL comprising:

a light generation layer for generating light in response to light passing therethrough;

mirror means disposed on opposite faces of said light generation layer for reflecting light generated in said light generation layer toward said light generation layer such that said reflected light adds coherently to said light generated in said light generation layer; and a reflective electrode deposited on a face of said mirror means, remote from said light generation layer, said method comprising a step of providing plural localized imperfection regions in said mirror means, each imperfection region causing light interacting therewith to be attenuated or shifted in phase relative to light that does not interact with said imperfection region to induce filamentation adjacent thereto, wherein said step of providing plural localized regions includes a step of forming localized regions of different refractive index in said mirror means and, wherein:

said mirror means includes plural layers disposed substantially parallel to said light generation layer, and additionally includes a phase correcting layer remote from the light generation layer, and wherein, the localized regions of different refractive index are formed in the phase correcting layer.

* * * * *